United States Patent [19]

Beckenbach et al.

[11] Patent Number: 4,617,524

[45] Date of Patent: Oct. 14, 1986

[54] INTEGRATED AMPLIFIER CIRCUIT HAVING RC NETWORK TO SUPPRESS OSCILLATION

[75] Inventors: Walter Beckenbach; Heinz Rinderle, both of Heilbronn, Fed. Rep. of Germany

[73] Assignee: Telefunken Electronic GmbH, Heilbronn, Fed. Rep. of Germany

[21] Appl. No.: 629,620

[22] Filed: Jul. 11, 1984

[30] Foreign Application Priority Data

Jul. 27, 1983 [DE] Fed. Rep. of Germany ....... 3326958

[51] Int. Cl.$^4$ .............................................. H03F 3/04
[52] U.S. Cl. .................................... 330/307; 330/302

[58] Field of Search ................ 330/302–307; 357/14, 51

[56] References Cited

U.S. PATENT DOCUMENTS 4,027,271 5/1977 Cave et al. ........................... 330/307

Primary Examiner—Gene Wan
Attorney, Agent, or Firm—Spencer & Frank

[57] ABSTRACT

An integrated amplifier circuit which includes a semiconductor substrate, an amplifier transistor fabricated on the substrate, and an RC network fabricated on the substrate to suppress undesired, self-excited oscillations, the RC network being connected between the base of the transistor and the substrate.

30 Claims, 7 Drawing Figures

INTEGRATED AMPLIFIER CIRCUIT HAVING RC NETWORK TO SUPPRESS OSCILLATION

BACKGROUND OF THE INVENTION

As is known, there is often the danger of self-excitation of undesired oscillations in amplifier circuits comprising transistors with a high transit frequency. Undesired oscillations caused by the influence of unavoidable parasitic inductances and capacitances in cooperation with the amplifier transistor occur in a frequency range generally located substantially outside the operating frequency. The parasitic inductances can be traced back to the electrode leads and the parasitic capacitances to capacitances located in the semiconductor body (e.g. barrier layer capacitances) and also to external wiring capacitances. Both parasitic components are also referred to as parasitic reactances. While the operating frequency in a VHF amplifier is, for example, 100 MHz, the undesired parasitic oscillations occur in the upper VHF or UHF range. The undesired oscillations result in reception interference and spurious radiation.

The undesired oscillations occur, above all, when the amplifier transistor is used in a grounded base circuit. In an emitter base circuit, however, the undesired oscillations are less frequent or easier to avoid. The problems of self-excitation of oscillations is particularly great in integrated circuits since, e.g. relatively large values exist for the parasitic lead inductances. It is known to prevent the undesired parasitic oscillations by providing the leads with coverings of ferrite beads or by placing ferrite beads or resistors in lead paths to the amplifier transistor. The known solutions do, however, have the disadvantage that the characteristics of the amplifier circuit are negatively influenced in the operating frequency range, particlarly when relatively large lead inductances are caused by the integration, and, more particularly, by an increase in the inherent noise of the amplifier circuit. The relatively high cost of known solutions is a further disadvantage. Since no satisfactory solution has yet been found to the aforementioned problems, pre-amplifiers for VHF uses are still made in accordance with the conventional technique today.

SUMMARY OF THE INVENTION

The object of the invention is to provide a solution which enables the manufacture of pre-amplifiers in accordance with the integrated technique using bipolar transistors with transit frequencies of several GHz and the prevention of undesired oscillations in integrated pre-amplifiers to as high a degree as possible.

This object is attained in accordance with the invention by an amplifier circuit which comprises an amplifier transistor and is integrated, and wherein an RC section of such dimensions that undesired self-excitation of oscillations is suppressed is integrated in the semiconductor body in which the amplifier transistor is located.

The RC network is connected between the base of the amplifier transistor and the semiconductor substrate. It is advantageous to use the invention in amplifier circuits operating in the VHF range (50–300 MHz). In accordance with a further development of the invention, a resistor is connected between the collector zone and the collector electrode of the amplifier transistor as an additional damping measure. According to a further developement of the invention, a capacitance is also connected, in addition to this resistor, between the collector zone of the amplifier transistor and the semiconductor substrate.

The invention is particularly advantageous in the event that the base zone of the amplifier transistor is externally connected, i.e., if the base zone is contacted by an external lead, above all, if the base to ground is short circuited in the operating frequency by a capacitance.

The amplifier transistor according to the invention, together with the RC network or resistor (possibly including capacitance) is generally a component of a relatively large integrated circuit. The collector zone of the amplifier transistor, preferably in the form of a vertical transistor, is preferably surrounded by a semiconductor area of a conductivity type opposite to that of the collector zone.

BRIEF DESCRIPTION OF THE DRAWINGS

The invention will now be described in greater detail, by way of examples, with reference to the drawings, in which.

DESCRIPTION OF THE PREFERRED EMBODIMENTS

Figure 1:
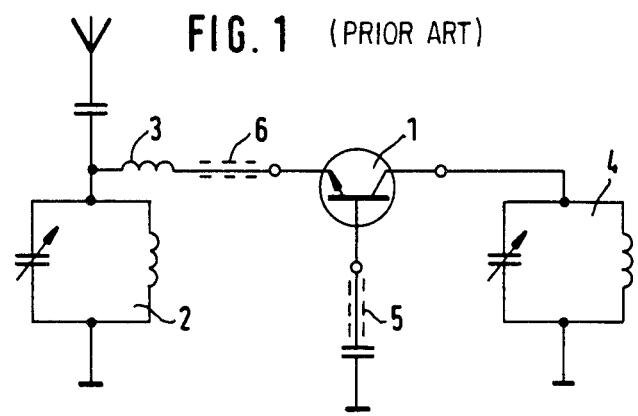
FIG. 1 shows the principal design of an amplifier circuit.

FIG. 1 shows the principal design of an amplifier circuit with a bipolar transistor 1 in a grounded base circuit, as used, for example, for VHF receivers. In the circuit shown in FIG. 1, the antenna signal is fed to a tuned input circuit 2 where it is preselected. The selected input signal reaches the emitter of the amplifier transistor 1 via the coupling inductance 3. The amplified output signal is fed to a further selection circuit 4 and further selected there. In order to avoid undesired oscillations, ferrite beads 5 and 6 are provided in the base and emitter lead in the known circuit of FIG. 1.

These known measures do, however, have the aforementioned disadvantage of causing additional noise. In integrated circuits, the oscillation danger is even greater than in conventional circuits.

Figure 2:
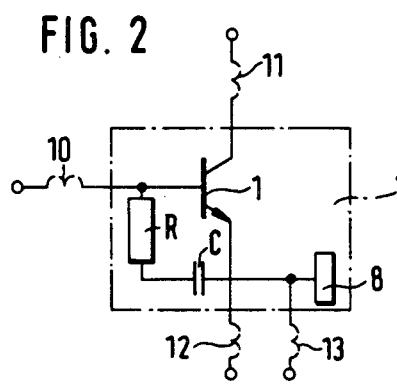
FIG. 2 shows an amplifier transistor with an RC network.

To enable the amplifier to be designed in accordance with the integrated technique, without the occurrence of parasitic oscillations and additional noise caused by external damping measures such as ferrite beads, an RC network connected between the base of the amplifier transistor 1 and the semiconductor substrate 7 is integrated, in accordance with the invention, in FIG. 2, with the amplifier transistor 1 in a common semiconductor body 7. In practical application, it is expedient to arrange the resistor R of the RC network on the base side, although the capacitance C may, of course, also be arranged on the base side.

The RC network is of such dimensons that undesired self-excitation of oscillations is suppressed to as high a degree as possible. In practical application, the frequency at which the system effects the undesired oscillations without the inventive means is first determined.

This frequency may, for example, be ascertained by a spectrum analyzer. When this frequency is known, the product R.C (time constant) is obtainable from the relationship $\frac{1}{2}$ nf$_{par.}$=R.C. If the frequency is known, the resistance R can be calculated from this relationship, but the capacitance C is to be chosen as large as possible.

Figure 3:
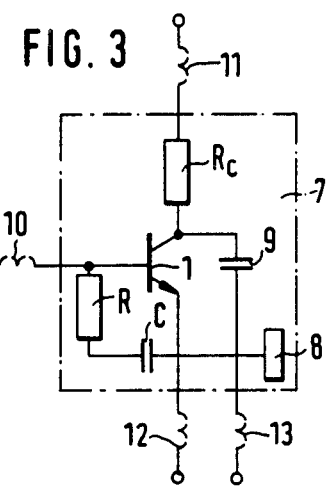
FIG. 3 shows undesired lead inductances.

The arrangement shown in FIG. 3 differs from the arrangement of FIG. 2 in that in addition to the RC section there is also provided a resistor R$_c$ which likewise contributes towards abatement of the tendency towards parasitic oscillations and therefore promotes the effect of the RC network. The resistor R$_c$ cooperates with the capacitance 9 which is automatically provided between the collector and the semiconductor substrate 7 in an integrated transistor. The inductances 10, 11, 12 and 13 shown in dashed lines in FIG. 3 are lead inductances which are partly also responsible for the undesired oscillations.

Figure 4:
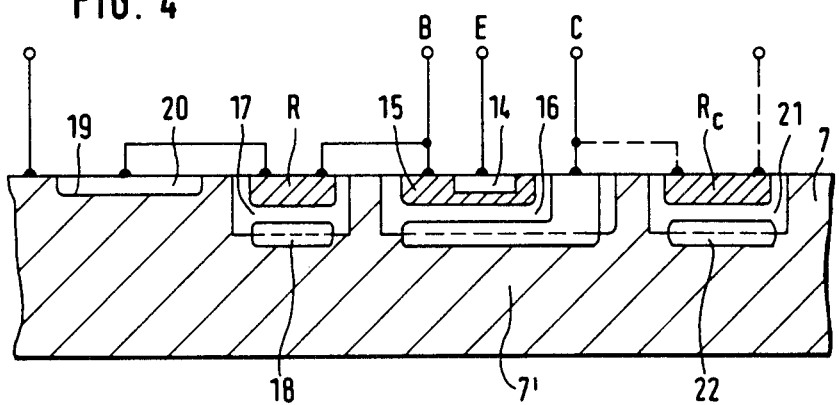
FIG. 4 shows the embodiment of the invention in accordance with the integrated technique.

FIG. 4 shows the embodiment of the invention in accordance with the integrated technique. The amplifier transistor is located in the arrangement of FIG. 4 together with the RC network in a common semiconductor body 7. The amplifier transistor consists of the emitter zone 14, the base zone 15 and the collector zone 16. The collector zone 16 is surrounded by a semiconductor area 7' of a conductivity type opposite to that of the collector zone 16. The resistor R of the RC network provided in accordance with the invention is surrounded by a semiconductor area 17 of a conductivity type opposite to that of the resistor R. A so-called buried layer 18 is located beneath the resistor R. The capacitance C of the RC network according to FIG. 4 is in the form of a pn junction 19 which the semiconductor zone 20 forms with the semiconductor substrate 7'. The resistor R is connected on the one side to the semiconductor zone 20 and thereby to the capacitance C. The other part of the capacitor C is formed by the semiconductor substrate 7'.

In the arrangement of FIG. 4 a resistor R$_c$ which, as described in connection with FIG. 3, serves as additional measure for further damping of parasitic oscillations is also provided. The resistor R$_c$ is separated from the semiconductor substrate 7' by a semiconductor zone 21 of a conductivity type opposite to that of the semiconductor substrate and also of the resistor zone. The semiconductor zone 22 is a buried layer.

Figure 5:
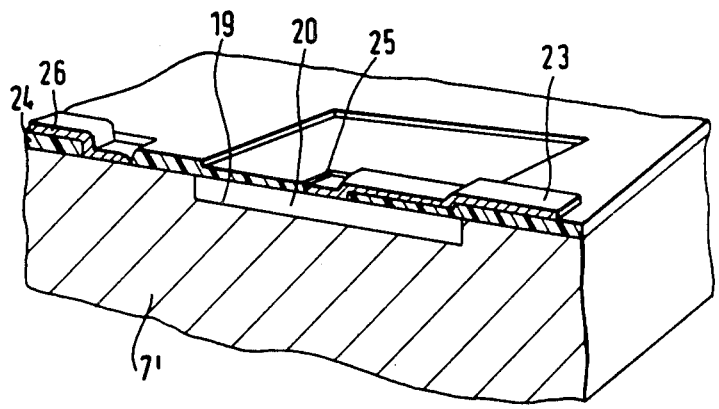
FIG. 5 shows an embodiment for the RC network.

FIG. 5 shows a special embodiment for the RC network according to the invention. The RC network consists in the embodiment of FIG. 5 of the capacitance C which as in the arrangement of FIG. 4 is formed by the semiconductor zone 20 and the adjacent substrate 7' or by the pn junction 19, and also of the resistor R which in the embodiment of FIG. 5 is not in the form of a separate resistor zone but is represented by the transition resistor existing between the semiconductor zone 20 and the conduction path 23 contacting it. The size of this resistor is dependent on the contact surface between the conduction path 23 and the semiconductor zone 20 which, if an insulating layer 24 is provided, is determined by the size of the contact window 25 in the insulating layer 24. The same applies to the transition surface between the conduction path 26 contacting the semiconductor substrate 7' and the semiconductor substrate 7', i.e., at this point also an additional resistor which likewise contributes towards intentional oscillation damping may be formed.

Figure 6:
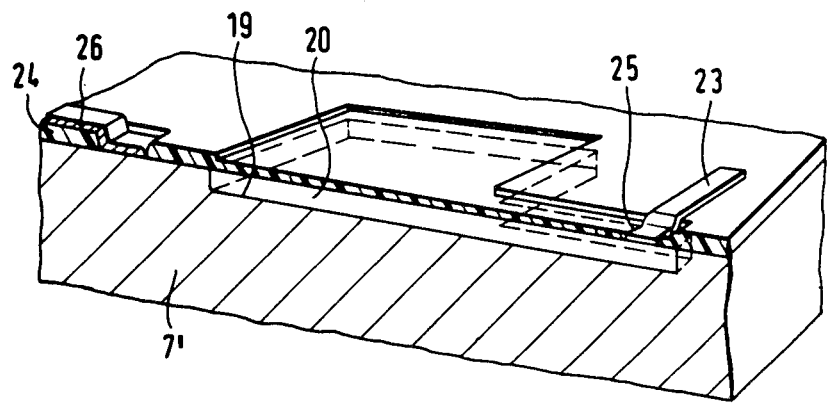
FIG. 6 shows a circuit with the resistor and the capacitance zone in the semiconductor body.

In accordance with another embodiment of the invention, it is also possible to combine the resistor zone R of FIG. 4 with the semiconductor zone 20 of the capacitance to form a common semiconductor zone according to FIG. 6. In this case, the resistor zone R is so to speak an end section of the capacitance zone C.

Figure 7:
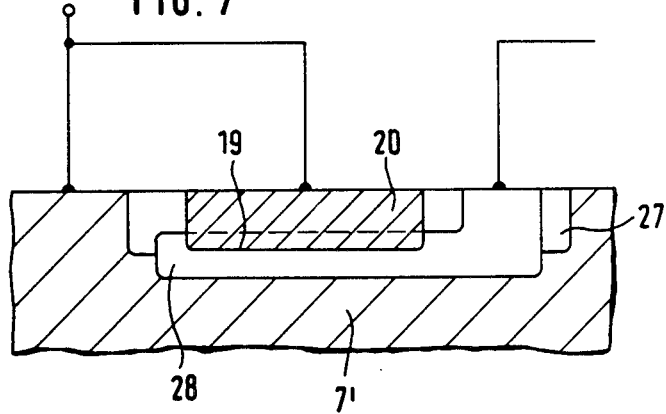
FIG. 7 shows a special embodiment of the capacitance.

FIG. 7 shows a special embodiment of the capacitance C wherein the semiconductor zone 20 does not directly border on the semiconductor substrate 7', but is separated from the semiconductor substrate 7' by a semiconductor zone 27. The conductivity type of the semiconductor zone 27 is opposite to that of the semiconductor zone 20 and the substrate 7'. In addition, a buried layer 28 which forms with the semiconductor zone 20 the pn junction 19 and therefore the required barrier layer capacitance is also provided. The buried layer 28 and the semiconductor zone 20 are of such high resistance that the desired high cut-off voltage is attained. A higher cut-off voltage is required for the pn junction 19 if relatively high potential differences are present between the base zone and the substrate.

Due to the interposition of the separation zone 27, the semiconductor zone 20 of FIG. 7 is of a different conductivity type than the semiconductor zone 20 in the arrangement of FIG. 7 since it is not connected to the base zone, as in the arrangement of FIG. 4, but to the semiconductor substrate 7'.

In the arrangement of FIG. 7, the interposed zone or the buried layer 28 of the same conductivity type is connected to the base zone of the transistor. If the invention fails to provide complete damping, additional external measures (e.g. ferrite beads) may also be taken. The external damping which may be required is, however, substantially less if the invention is employed than without use of the invention, with the result that the negative effects of external measures on the noise and also the costs when the invention is employed are substantially less.

The invention is, of course, not limited to VHF uses; it may likewise be used in other circuit arrangements such as, for example, intermediate frequency amplifiers.

What is claimed is:

1. An integrated amplifier circuit comprising: a semiconductor substrate; and amplifier transistor having an emitter zone, a base zone, and a collector zone fabricated on the substrate; and an RC network fabricated on the substrate to suppress undesired self-excited oscillations, the RC network being connected between the base zone of the amplifier transistor and the substrate.

2. An amplifier circuit according to claim 1, wherein a resistor is connected between the collector zone and the collector electrode.

3. An amplifier circuit according to claim 2, wherein a capacitance is connected between the collector zone and the semiconductor substrate.

4. An amplifier circuit according to claim 1, wherein the collector zone is surrounded by a semiconductor zone of a conductivity type opposite to that of the collector zone.

5. An amplifier circuit according to claim 1, further comprising a conduction path, and wherein the capacitance C of the RC network includes a semiconductor zone and the resistor R of the RC combination is formed by a transition resistor existing between the semiconductor zone and the conduction path, the conduction path contacting the semiconductor zone.

6. An amplifier circuit according to claim 5, wherein the size of the transition resistor is determined by the size of the contact surface between the conduction path and the semiconductor zone.

7. An amplifier circuit according to claim 6, further comprising an insulating layer on the substrate, the insulating layer having a contacting window, and wherein the conduction path has a portion that is supported on the insulating layer and a portion that is exposed to the contacting window, the size of the transition resistor being determined by the size of a contacting window.

8. An amplifier circuit according to claim 1, wherein the RC network includes a semiconductor zone of the capacitance (C) located in semiconductor substrate, the semiconductor zone of the capacitance (C) being surrounded by a separation zone of a conductivity type opposite to that of the semiconductor zone.

9. An amplifier circuit according to claim 8, wherein the separation zone contains a buried layer with a connection zone which extends to the surface and is connected to the base zone.

10. An amplifier circuit according to claim 8, wherein the RC network includes a pn junction, and wherein the resistance in the area of the pn junction is higher than the resistance of the semiconductor substrate.

11. An amplifier circuit according to claim 8, wherein the separation zone is connected to the base zone and the semiconductor zone of the capacitance (C) is connected to the semiconductor substrate.

12. An amplifier circuit according to claim 11, wherein the separation zone contains a buried layer with a connection zone which extends to the surface and is connected to the base zone.

13. An amplifier circuit according to claim 1, wherein an integrated emitter series resistor is connected to the emitter zone.

14. An amplifier circuit according to claim 13, wherein the emitter series resistor is of such dimensions as to aid the suppresion of the self-excited oscillations.

15. An amplifier circuit according to claim 1, wherein said transistor comprises a common base amplifier.

16. An amplifier circuit according to claim 1, wherein said RC network comprises a resistor and a capacitor connected in series.

17. An amplifier circuit according to claim 1, wherein said RC network comprises a capacitor, and a resistor connected between the base of the transistor and the capacitor.

18. An integrated amplifier circuit comprising: a semiconductor substrate; an amplifier transistor fabricated on the substrate, said transistor having a collector zone and a collector electrode; an RC network fabricated on the substrate to suppress self-excited oscillations; and a resistor connected between the collector zone and the collector electrode.

19. An amplifier circuit according to claim 18, wherein a capacitance is connected between the collector zone and the semiconductor substrate.

20. An integrated amplifier circuit comprising: a semiconductor substrate; an amplifier transistor fabricated on the substrate, said transistor having a collector zone; and an RC network fabricated on the substrate to suppress self-excited oscillations, wherein the collector zone is surrounded by a semiconductor zone of a conductivity type opposite to that of the collector zone.

21. An integrated amplifier circuit comprising: a semiconductor substrate; an amplifier transistor fabricated on the substrate; a conduction path; and an RC network fabricated on the substrate to suppress self-excited oscillations, wherein the capacitance C of the RC network includes a semiconductor zone and the resistor R of the RC combination is formed by a transition resistor existing between the semiconductor zone and the conduction path, the conduction path contacting the semiconductor zone.

22. An amplifier circuit according to claim 21, wherein the size of the transition resistor is determined by the size of the contact surface between the conduction path and the semiconductor zone.

23. An amplifier circuit according to claim 22, further comprising an insulating layer on the substrate, the insulating layer having a contacting window, and wherein the conduction path has a portion that is supported on the insulating layer and a portion that is exposed to the contacting window, the size of the transition resistor being determined by the size of the contacting window.

24. An integrated amplifier circuit comprising: a semiconductor substrate; an amplifier transistor fabricated on the substrate; and an RC network fabricated on the substrate to suppress self-excited oscillations, wherein the RC network includes a semiconductor zone of the capacitance (C) located in the semiconductor substrate, the semiconductor zone of the capacitance (C) being surrounded by a separation zone of a conductivity type opposite to that of the semiconductor zone.

25. An amplifier circuit according to claim 24, wherein the amplifier transistor includes a base zone, the separation zone is connected to the base zone, and the semiconductor zone of the capacitance (C) is connected to the semiconductor substrate.

26. An amplifier circuit according to claim 25, wherein the separation zone contains a buried layer with a connection zone which extends to the surface and is connected to the base zone.

27. An amplifier according to claim 24, wherein the separation zone contains a buried layer with a connection zone which extends to the surface and is connected to the base zone.

28. An amplifier circuit according to claim 24, wherein the RC network includes a pn junction, and wherein the resistance in the area of the pn junction is higher than the resistance of the semiconductor substrate.

29. An integrated amplifier circuit comprising: a semiconductor substrate; an amplifier transistor having an emitter zone, a base zone, and a collector zone fabricated on the substrate; and RC network fabricated on the substrate to suppress self-excited oscillations, the RC network being connected to the base zone; and an integrated emitter series resistor connected to the emitter zone.

30. An amplifier circuit according to claim 29, wherein the emitter series resistor is of such dimensions as to aid the suppression of the self-excited oscillations.

* * * * *